June 19, 1956 L. M. MINSK ET AL 2,751,296

PHOTOSENSITIZATION OF CINNAMIC ACID ESTERS OF CELLULOSE

Filed Sept. 6, 1952

EARL M. ROBERTSON
LOUIS M. MINSK
WERTER P. VAN DEUSEN
INVENTOR.

BY Daniel J. Mayne
W. H. McDowell
ATT'Y & AG'T

United States Patent Office 2,751,296

Patented June 19, 1956

2,751,296

PHOTOSENSITIZATION OF CINNAMIC ACID ESTERS OF CELLULOSE

Louis M. Minsk, Werter P. Van Deusen, and Earl M. Robertson, Rochester, N. Y., assignors to Eastman Kodak Company, Rochester, N. Y., a corporation of New Jersey Application September 6, 1952, Serial No. 308,283

14 Claims. (Cl. 95—7)

Figure 1:
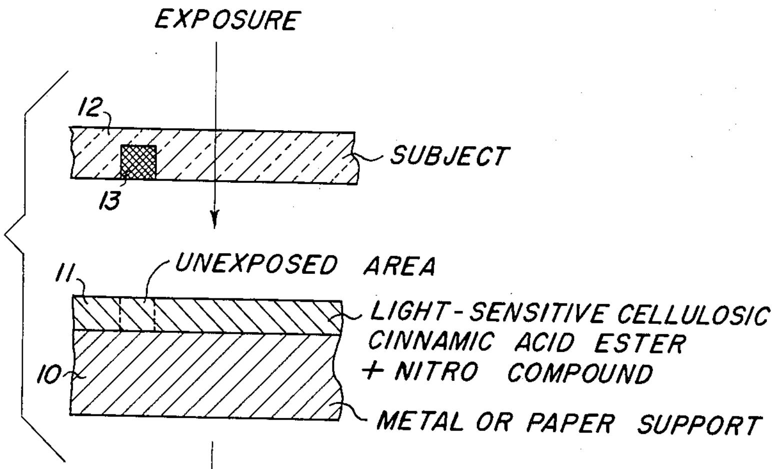

This application is a continuation-in-part of our U. S. patent application Serial No. 148,684, filed March 9, 1950, now U. S. Patent 2,610,120.

This invention relates to the photosensitization of cinnamic acid esters of cellulose and hydroxyl containing cellulose derivatives.

It is well known in the art of photomechanical reproduction to utilize various materials such as bichromated shellac, albumin or polyvinyl alcohol for forming resist images upon various supports such as metal plates. The support is then etched or otherwise treated in the areas not covered by the resist image and the resultant plate, usually after removal of the resist image, is used for printing. One method of forming relief images on metal supports is disclosed in the Murray U. S. Patent 1,965,710, granted July 10, 1934, and includes using as a sensitive layer for forming a resist image, a layer of cinnamal ketone containing another resinous material which, after exposure under a design, may be selectively dissolved in the unexposed area whereby the area of the support thus bared may be etched.

We have discovered certain polymeric materials which are light sensitive and which have properties superior to the mentioned dichromated materials or cinnamal ketone. Furthermore, we have discovered that these polymeric materials can be sensitized to increase their sensitivity to actinic rays several hundred times. Therefore, one object of our invention is to provide the superior light-sensitive materials of particular use in making resists for printing plates. A further object is to provide sensitizer compounds capable of increasing the light sensitivity of the polymeric materials. Another object is to describe the preferred applications for the sensitized materials. Other objects will become apparent from the following description of our invention.

The objects of our invention are accomplished in part by utilizing cinnamic acid esters of cellulose and hydroxyl containing derivatives of cellulose as the combined carrier and light-sensitive material, and a nitro compound as a light sensitizing agent for the cinnamic acid esters. Other objects are accomplished by utilizing the sensitive compositions for making resist images for printing plates. Suitable light-sensitive cinnamic acid esters are, for example, cinnamic acid esters of cellulose as well as of partially alkylated cellulose, either completely or partially hydroxy-alkylated cellulose and partially esterified cellulose.

The polymeric materials sensitized with the nitro compounds are exposed in the usual manner to line or half-tone subjects and after exposure are treated with a solvent to remove the coating only in the unexposed area of the plate and an intermediate plate is thus obtained provided with a resinous resist image useful in a variety of processes to form final printing plates.

In the accompanying drawings, the various figures show in enlarged cross-sectional view the structure of a representative sensitive element of our invention at various stages in the process of producing intermediate printing plates having selected areas covered by the cellulosic resist image.

The light-sensitive cellulosic materials of the invention are obtained by esterification of cellulose and its hydroxyl-containing derivatives such as esterification-grade cellulose, with a cinnamic acid halide such as cinnamic acid, o-chloro, $\alpha$-phenyl, $\beta$-phenyl or m-nitro cinnamic acid chlorides in organic solvent media such as pyridine as follows:

*Example 1*

Cellulose acetate cinnamate is obtained by dispersing 20 grams of hydrolyzed cellulose acetate (24.6% acetyl) in 300 cc. of pyridine on a steam bath. The dope is cooled to 50° C. and 60 grams of cinnamoyl chloride are added with shaking. The reaction mixture is then placed on a 50° C. bath for 4 hours. The dope is then diluted with acetone and poured into water to precipitate the ester. The product is washed free of chloride with water and dried in a vacuum desiccator under a constantly applied vacuum. Yield: 49 grams. Cellulose acetate-o-chlorocinnamate etc. are prepared in the same manner.

*Example 2*

Cellulose cinnamate is obtained by suspending 20 grams of regenerated cellulose in 200 cc. of dry pyridine on a steam bath for 16 hours. The mixture is then cooled and 83 grams of cinnamoyl chloride are added with shaking. The flask is immersed in a 65° C. water bath for 23 hours with occasional shaking. The dope is then diluted with 400 cc. of 1,4-dioxane and filtered by suction through felt. The filtrate is further diluted with 100 cc. of 1,4-dioxane and poured into water to precipitate the ester which is further washed with tap water to remove impurities. The fibrous product is dried at room temperature in a stream of air. Analysis: C. 70.6%; H 5.2%.

*Example 3*

Ten grams of hydroxyethyl cellulose obtained as described in the Minsk et al. invention designated hereinafter are mixed with 100 cc. of dry pyridine and heated on a steam bath overnight. To this is added a slurry of 25 grams of m-nitro-cinnamoyl chloride in 150 cc. of dry pyridine and the mixture stirred and heated at 60° C. for 8 hours. The resulting amber dope is then poured into water to precipitate a white fibrous material, the analysis of which showed a nitrogen content of 3.4 percent. When the m-nitrocinnamic acid ester of hydroxyethyl cellulose thus prepared is evaluated sensitometrically without the addition of any sensitizing agent, a speed value of 650 is obtained. This is unusual inasmuch as no cinnamic acid ester of a hydroxyl-containing polymeric material previously investigated possessed such a high speed, in the absence of a sensitizing agent.

In a manner similar to that of the above examples, other hydroxyalkyl celluloses such as hydroxypropyl cellulose can be esterified with the indicated cinnamic acid halides.

The cellulose and hydroxy-containing cellulose derivatives which are contemplated by our invention for acylation in the manner of the above examples and sensitization with the nitro compounds, include esterification-grade cellulose such as cotton linters and wood pulp having a high alpha-cellulose content as well as regenerated cellulose. Cellulose derivatives such as the partially esterified cellulose acetate in the above example are preferably obtained by esterifying cellulose with aliphatic or aromatic acid halides or anhydrides followed by partial de-esterification in a well-known manner. The cellulose derivatives also include well-known ethers of cellulose still containing hydroxyl groups, hydroxy alkyl cellulose ethers either partially or substantially fully hydroxy-alkylated such as hydroxy ethyl cellulose, the preparation of which are described for example in U. S. Patents 2,330,236, 2,327,397, 2,173,470, 2,110,369 and 1,994,038, and in Minsk and Van Deusen U. S. patent application Serial No. 308,284, filed concurrently herewith. The latter invention particularly describes the preparation of cinnamic acid esters of hydroxy alkyl cellulose useful in the present invention, e. g., hydroxy ethyl cellulose cinnamate, o-chlorocinnamate and m-nitrocinnamate. Other hydroxyl-containing cellulose derivatives include carboxy alkyl celluloses still containing hydroxy groups.

A typical resist-lacquer composition useful for forming resist images on printing plates is compounded of the following materials:

| | |
|---|---|
| Cellulose acetate/cinnamate | grams 2.0 |
| 2-methoxyethyl acetate | cc 100 |
| Nitro compound | grams 0.20 |

The solvent for coating the composition as well as for the developer will vary somewhat depending upon the particular cinnamic acid ester in use as indicated above.

Solvents for cellulose acetate o-chlorocinnamate are:

Tetrahydrofurfuryl alcohol
Benzyl alcohol
2-methoxy ethanol
1,4-dioxane
Acetone
Acetylacetone
Mesityl oxide
Cyclohexanone
Furfural
Benzaldehyde
Acetic acid (glacial)
Methyl acetate
2-methoxyethyl acetate
Ethylene chlorohydrin
Diethyl formamide
Dimethyl formamide
Morpholine
Anisole
2-ethoxy ethanol
Methyl ethyl ketone Solvents for cellulose acetate cinnamate include those for cellulose acetate o-chloro cinnamate except:

Anisole
2-ethoxy ethanol
Methyl ethyl ketone

Solvents for $\beta$-hydroxy ethyl cellulose cinnamate include those for cellulose acetate-o-chlorocinnamate except:

Anisole
2-ethoxyethanol
Methyl ethyl ketone
Acetic acid

Solvents for cellulose tricinnamate are:

1,4-dioxane
Dimethyl formamide
Diethyl formamide
Morpholine

The concentration of sensitizer compound in the coating formula depends somewhat upon the solubility in the particular solvent used, the compatibility of the sensitizer with the light-sensitive cellulose cinnamic acid ester, and of course the amount of ester present. In the case of cellulose cinnamate and cellulose acetate cinnamate, for example, from about 2 to 25%, preferably 10%, by weight of nitro compound based upon the weight of cinnamic acid ester gives useful results. The concentration of the cellulosic cinnamate in the coating formula can be varied as required by the particular conditions of coating under consideration, about 2.0% cellulosic material being useful for grained metal or paper plates and about 7.5% for polished metal such as copper, zinc, and magnesium.

Examples of nitro compounds which are suitable as sensitizers for the cinnamic acid esters of cellulose and its hydroxy-containing derivatives compared to the sensitizing action of the same sensitizers with a cinnamic acid ester of polyvinyl alcohol, are tabulated in the following table, the value opposite each compound indicating the relative speed obtained with the indicated cinnamic acid ester. The coatings from which the speed evaluations were obtained were made from solutions of 2.0 grams of the light-sensitive cinnamic acid ester and 0.20 gram of the nitro compound in 100 cc. of 1,4-dioxane. For comparison purposes on the same scale, a dichromate sensitized shellac coating has a speed value of approximately 30.

| Sensitizer | Polyvinyl Cinnamate | Cellulose Tricinnamate | Cellulose Acetate Cinnamate | Cellulose-$\beta$-hydroxy ethyl Ether Cinnamate |
|---|---|---|---|---|
| unsensitized | 2.2 | 9 | 1.1 | 4.5 |
| p-dinitrobenzene | 38 | 70 | 9 | 45 |
| p-nitrodiphenyl | 180 | 320 | 28 | 130 |
| $\alpha$-nitronaphthalene | 180 | 650 | 100 | 280 |
| $\beta$-nitrostyrene | 35 | 90 | 13 | 45 |
| p-nitrophenol | 71 | 180 | 20 | 100 |
| 2,6-dichloro-4-nitrophenol | 69 | 90 | 14 | 100 |
| p-nitroanisole | 62 | 130 | 22 | 100 |
| 2,6-dichloro-4-nitroaniline | 330 | 650 | 130 | 650 |
| 2,4,6-trinitroaniline | 390 | 450 | 90 | 650 |
| p-nitroaniline | 110 | — | 45 | 320 |
| o-nitroaniline | 1.5 | 2.2 | 1.1 | 1.1 |
| 2,4-dinitroaniline | 89 | — | 13 | 130 |
| picric acid | 17 | — | 4.5 | 80 |
| 6-nitrobenzimidazole | 110 | — | 16 | 130 |
| 2,4-dinitro-6-chloroaniline | 89 | — | 4.5 | 130 |
| 4-nitrophthalimide | 65 | — | 3.5 | — |
| 4-nitro-2-chloroaniline | 300 | — | — | 400 |
| nitrobenzene | 7.8 | 16 | — | 13 |

The above compounds are classifiable as nitro aryl compounds having a nucleus containing from 6 to 10 carbon atoms, i. e. benzene and naphthalene nuclei, 1 to 3 nitro groups being attached to the nucleus, with the limitation that the mono-nitro compounds are free of amino, hydroxyl and formyl groups in a position ortho to the nitro group, all of the nitro aryl compounds being free of an amino and a hydroxyl group in positions ortho to each other and free of carboxyl and sulfonic acid groups. Nitro aryl compounds not possessing these structural limitations appear to have little if any sensitizing effect upon the cellulosic cinnamic acid esters for example, 6-nitroaniline (see table above), 2-amino-4,6-dinitrophenol, o-nitrobenzaldehyde and o-nitrophenol. Nitro aryl compounds containing carboxylic or sulfonic acid groups are either relatively poor sensitizers or are not usable in the coating and developing solvent systems because of limited solubility in organic solvents. Sensitizers comprising the preferred embodiment of our invention are included in the above list and for the most part are nitro compounds having the general formula:

$$R—NO_2$$

wherein R represents a mononuclear aryl radical containing at least one of the substituents nitro, amino, hydroxyl, phenyl, chloro, bromo, alkyl, alkoxy, phenoxy, dialkylamino, formyl, trifluoromethyl and fused-on phenyl, the mononitro compounds being free of amino, hydroxy, and formyl groups in a position ortho to the nitro group and the nitro compounds being free of an amino and a hydroxyl group in positions ortho to each other and free of carboxyl and sulfo groups, and the mentioned aryl radical containing not more than three of any one of the mentioned substituents.

The mononitro aniline compounds free of amino, hydroxyl and formyl groups ortho to the nitro group and free of amino and hydroxyl groups ortho to each and carboxyl and sulfo groups are important. Similarly, the dinitroaniline sensitizers free of amino and hydroxyl groups ortho to each other and carboxyl and sulfo groups represent a valuable group of sensitizers. Of special value are the 2-chloro-4-nitroaniline compounds containing no other substituent except chlorine on the aryl nucleus containing the nitro group.

Our invention will be understood by consideration of the accompanying drawings and the following examples illustrating various means of employing the light-sensitive materials for forming resist images and printing plates therefrom.

*Example 4*

Figure 2:
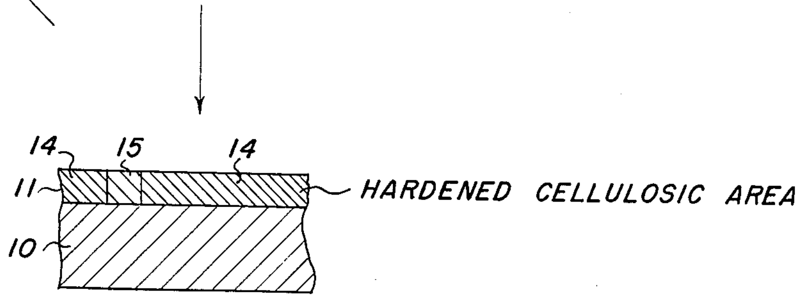
Figure 3:
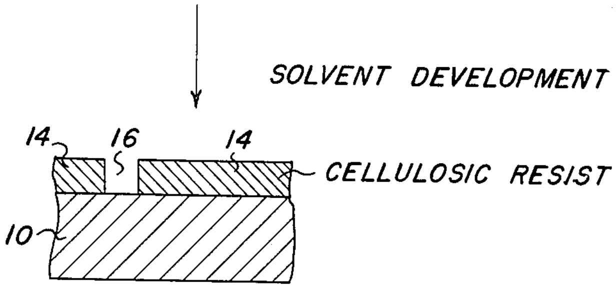

A cinnamic acid ester such as cellulose acetate cinnamate (2.0 grams), the preparation of which is described above, was dissolved in 100 cc. β-methoxyethyl acetate and 0.20 gram of 2,4,6-trinitroaniline was then dissolved in the resinous dope. The order of mixing the components is not especially critical. The dope was then poured onto a lithographic paper printing plate support such as a paper sheet carrying a layer of material which is repellent to greasy printing inks when wet and the coated plate was whirled at approximately 50 to 180 R. P. M. until the coating was dry. The operation is preferably carried out in subdued light. The sensitized plate appears as shown in enlarged cross-sectional view in Figure 1 of the drawings wherein layer 10 represents the paper support and layer 11 the cellulose acetate cinnamate sensitized with the nitro compound. The plate was then exposed under a line or halftone image at 4 feet from a 35-ampere white flame carbon arc for about 1 minute, as shown in Figure 1 of the drawings wherein the subject is represented by a transparent layer 12 containing an image 13 opaque to light. The result of exposure is to insolubilize the layer in the exposed region 14 of layer 11 leaving unaffected material in the unexposed area 15 as shown in Figure 2 in the drawings. After exposure, development was carried out for 2 minutes in a tray of β-methoxyethyl acetate. The result was that the unexposed area 15 of the plate was readily dissolved leaving a cellulosic cinnamate resist 14 on the support 10 and in the unexposed areas 16 from which the cellulosic ester and sensitizer had been removed, the ink-repellent area of the support was revealed as in Figure 3. If desired, the resist can now be dyed, with a suitable dye to increase its visibility, dye being selected which does not stain the non-printing areas 16 or the dye may have previously been incorporated into the light-sensitive composition. At this stage the plate can be used as a lithographic printing plate or further processed depending upon the particular support which has been used or the photomechanical process under consideration. Thus, when applying the above procedure to making etched zinc halftone images, the above type of coating was coated on a degreased photoengraving zinc plate, dried, exposed, developed and etched for four minutes with 10% nitric acid solution, to which a wetting agent may be added, to obtain a relief plate. The plate was then rubbed to remove the resist, the removal being aided, if desired, by use of a solvent such as benzene or acetone.

Other uses to which the cellulosic cinnamic acid esters may be put are those disclosed in the mentioned invention, of which this application is a continuation-in-part, for example, in making resist images, in the production of bi-metallic printing plates, etched copper halftone images, printing plates having cellulose ester supports, grained zinc or aluminum lithographic plates, zincated lithographic printing plates, ungrained copper printing plates for pre-proving copper-chromium bi-metallic plates, etc.

As indicated above, the type of printing plate obtained depends somewhat upon the support used. Resists on grained metal and zincated supports have been described, these supports having their surfaces thus prepared, when moistened with water, are repellent to the usual greasy printing inks. Cellulose ester supports subsequently surface hydrolyzed have been mentioned and other ink-repellent surfaces which may be provided with resist images according to our invention include plates or fibrous supports having a hydrophilic surface, for example, of water permeable cellulose ether, polyvinyl alcohol, partially hydrolyzed polyvinyl esters, gum arabic, acrylic acid polymers and copolymers, casein, and the like. The mentioned techniques for making aluminum plates can be employed for making an aluminum plate having aluminum foil as the metal support. In this instance, since handling of thin foil is difficult, it is preferable to reinforce it, for example, by lamination with a paper backing, the surface away from the metal foil preferably carrying a water resistant coating such as wax, cellulose ester or synthetic resin applied subsequent or prior to lamination.

As indicated above the cinnamic acid esters of cellulose and its hydroxyl-containing cellulose derivatives are superior to previously known materials containing the cinnamoyl group and also superior to bichromated materials particularly since there is no tendency for the resist images obtained therefrom to dissolve away from the support during solvent development.

A further advantage of our sensitive materials lies in the fact that coatings of the cinnamic acid esters may be made considerably in advance of the time of actual usage and after storage are found to have been little affected by non-ideal conditions of temperature and humidity. Bichromated glue or albumin layers can be sensitized only slightly in advance of usage because of their poor keeping properties. Other advantages of our sensitive materials have been noted in the above examples. Accordingly, the present invention offers to the photoengraver and photolithographer a presensitized product having a wide diversity of usage.

A further advantage residing in our sensitive materials is the fact that no auxiliary resinous materials are required in addition to the cinnamic acid ester. That is, in the case of the prior art ketones referred to, it is necessary to use an auxiliary resin carrier for the sensitive ketone, whereas, according to our invention, the cellulosic cinnamic acid esters function both as the carrier and light-sensitive material and accordingly are more efficacious and produces superior results.

By the term resist composition as used herein and in the appended claims, we mean a system containing as its essential ingredients one of the cellulose or cellulose derivative cinnamic acid esters and one of the sensitizing agents of the invention, either as a solid mixture of chemicals, for example, as in a coating, or as a mixture of chemicals in an organic solvent solution.

What we claim is:

1. A photomechanical resist composition comprising a cinnamic acid ester of a member of the group consisting of cellulose and hydroxyl-containing cellulose derivatives, as a combined carrier and light-sensitive material and as a sensitizer for the composition a nitro aryl compound having a nucleus containing from 6 to 10 carbon atoms, from 1 to 3 nitro groups being attached to said nucleus, the mono-nitro compounds being free of amino, hydroxyl and formyl groups in a position ortho to the nitro group, said nitro aryl compounds being free of an amino and a hydroxyl group in positions ortho to each other, and free of carboxyl and sulfo groups.

2. The composition of claim 1 wherein the light-sensitive material is a cinnamic acid ester of cellulose.

3. The composition of claim 1 wherein the light-sensitive material is a cinnamic acid ester of a partially hydrolyzed cellulose organic acid ester.

4. The composition of claim 1 wherein the light-sensitive material is a cinnamic acid ester of a cellulose hydroxyalkyl ether.

5. A photomechanical resist composition comprising cellulose cinnamate as a combined carrier and light-sensitive material, and as a sensitizer for the composition a mononitroaniline compound free of amino, hydroxyl and formyl groups ortho to the nitro group of said compound, amino and hydroxyl groups ortho to each other, and carboxyl and sulfo groups.

6. A photomechanical resist composition comprising cellulose-β-hydroxyethyl cinnamate as a combined carrier and light-sensitive material, and as a sensitizer for the composition a mononitroaniline compound free of amino, hydroxyl and formyl groups ortho to the nitro group of said compound, amino and hydroxyl groups ortho to each other, and carboxyl and sulfo groups.

7. A photomechanical resist composition comprising cellulose acetate cinnamate as a combined carrier and light-sensitive material, and as a sensitizer for the composition a mononitroaniline compound free of amino, hydroxyl and formyl groups ortho to the nitro group of said compound, amino and hydroxyl groups ortho to each other, and carboxyl and sulfo groups.

8. A photomechanical resist composition comprising cellulose-β-hydroxyethyl cinnamate as a combined carrier and light-sensitive material, and as a sensitizer for the composition a dinitroaniline compound free of amino and hydroxyl groups ortho to each other and carboxyl and sulfo groups.

9. A photomechanical resist composition comprising cellulose acetate cinnamate as a combined carrier and light-sensitive material, and as a sensitizer for the composition a dinitroaniline compound free of amino and hydroxyl groups ortho to each other and carboxyl and sulfo groups.

10. A photomechanical resist composition comprising cellulose cinnamate as a combined carrier and light-sensitive material, and as a sensitizer for the composition 2,4,6-trinitroaniline.

11. A photomechanical resist composition comprising cellulose cinnamate as a combined carrier and light-sensitive material, and as a sensitizer for the composition 2,6-dichloro-4-nitroaniline.

12. A photomechanical resist composition comprising cellulose cinnamate as a combined carrier and light-sensitive material, and as a sensitizer for the composition α-nitronaphthalene.

13. A photomechanical resist composition compising cellulose-β-hydroxyethyl cinnamate as a combined carrier and light-sensitive material, and as a sensitizer for the composition 2,4,6-trinitroaniline.

14. A photomechanical resist composition comprising cellulose-β-hydroxyethyl cinnamate as a combined carrier and light-sensitive material, and as a sensitizer for the composition 2,6-dichloro-4-nitroaniline.

References Cited in the file of this patent

UNITED STATES PATENTS 1,880,808 Clarke et al. ---------------- Oct. 4, 1932

FOREIGN PATENTS 145,850 Austria ---------------- May 25, 1936

OTHER REFERENCES

Worden: Technology of Cellulose Esters, vol. 8 (1916), pp. 2702 and 2703. Pub. by Van Nostrand Co., New York.